United States Patent [19]
Petersen

[11] Patent Number: 6,034,438
[45] Date of Patent: *Mar. 7, 2000

[54] L-CONNECT ROUTING OF DIE SURFACE PADS TO THE DIE EDGE FOR STACKING IN A 3D ARRAY

[75] Inventor: Robert W. Petersen, Dublin, Calif.

[73] Assignee: The Regents of the University of California, Oakland, Calif.

[*] Notice: This patent issued on a continued prosecution application filed under 37 CFR 1.53(d), and is subject to the twenty year patent term provisions of 35 U.S.C. 154(a)(2).

[21] Appl. No.: 08/733,854

[22] Filed: Oct. 18, 1996

[51] Int. Cl.$^7$ .............................. H05K 3/36; H01L 29/04
[52] U.S. Cl. ......................... 257/786; 257/686; 257/694; 257/695
[58] Field of Search .................................. 257/686, 786, 257/694–695

[56] References Cited

U.S. PATENT DOCUMENTS

| | | | |
|---|---|---|---|
| 4,525,921 | 7/1985 | Carson et al. | 29/577 C |
| 4,646,128 | 2/1987 | Carson et al. | 357/74 |
| 4,992,847 | 2/1991 | Tuckerman | 357/68 |
| 5,107,586 | 4/1992 | Eichelberger et al. | 29/830 |
| 5,113,117 | 5/1992 | Brooks et al. | 257/724 |
| 5,126,286 | 6/1992 | Chance | 437/203 |
| 5,196,373 | 3/1993 | Beasom | 438/404 |
| 5,241,450 | 8/1993 | Bernhardt et al. | 257/724 |
| 5,266,833 | 11/1993 | Capps | 257/690 |
| 5,708,298 | 1/1998 | Masayuki et al. | 257/686 |
| 5,834,162 | 11/1998 | Malba | 430/317 |

OTHER PUBLICATIONS

C.L. Bertin et al., "Evaluation of a Three–Dimensional Memory Cube System", IEEE, 1993.
J.A. Minahan et al., "The 3D Stack in Short Form", IEEE, 1992.
W.J. Howell et al., "Area Array Solder Interconnection Technology for the Three–Dimensional Silicon Cube", IEEE, 1995.
S.N. Shanken et al., "Very High Density 3–D Packaging Of Integrated Circuits".

*Primary Examiner*—Leo P. Picard
*Assistant Examiner*—Hung Van Duong
*Attorney, Agent, or Firm*—L. E. Carnahan

[57] ABSTRACT

Integrated circuit chips and method of routing the interface pads from the face of the chip or die to one or more sidewall surfaces of the die. The interconnection is routed from the face of the die to one or more edges of the die, then routed over the edge of the die and onto the side surface. A new pad is then formed on the sidewall surface, which allows multiple die or chips to be stacked in a three-dimensional array, while enabling follow-on signal routing from the sidewall pads. The routing of the interconnects and formation of the sidewall pads can be carried out in an L-connect or L-shaped routing configuration, using a metalization process such as laser pantography.

17 Claims, 4 Drawing Sheets

L-CONNECT ROUTING OF DIE SURFACE PADS TO THE DIE EDGE FOR STACKING IN A 3D ARRAY

The United States Government has rights in this invention pursuant to Contract No. W-7405-ENG-48 between the United States Department of Energy and the University of California for the operation of Lawrence Livermore National Laboratory.

BACKGROUND OF THE INVENTION

The present invention is directed to increasing the memory density of integrated circuit memory chips, more particularly to enabling effective stacking of all types of integrated circuit chips, and more particularly to routing the interface pads of an integrated circuit chip to an edge or sidewall of the chip to enable stacking of the chips and follow-on signal routing.

Over the past decade substantial research and development efforts have been directed towards miniaturizing and increasing the density of integrated circuit (IC) chips or die. There is a current demand, for example, for greater memory density of IC memory chips. One solution to this demand is to package the chips closer together, so that the effective density per unit volume increases. The more efficient packaging of chips to increase the density is to stack them one on top of another into a single three-dimensional (3D) array. In order to stack the chip on top of each other, means must be provided to enable interconnection of the bond or interface pads located on the chip surface, usually the upper or top surface of the chip. Thus, the bond or interface pads must be extended to the edge surfaces or sidewalls of the chip, and must be exposed so that attachment to the next level of packaging is possible.

The present invention provides a means and method for extending the bond or interface pads to one or more edge surfaces or sidewalls of the chip or die. In this invention L-connects or L-shaped interconnects extend from each pad on the surface to a pad formed on an edge surface or side wall of the chip. The interconnects and the sidewall pads are formed by three-dimensional metalization processes, such as laser pantography. Thus, stacking and interconnecting of chips to produce 3D arrays can be readily accomplished.

SUMMARY OF THE INVENTION

An object of the present invention is to enable stacking of integrated circuit (IC) chips or die.

A further object of the invention is to provide a means and method for extending interface pads to a side surface of a chip or die.

Another object of the invention is to provide L-shaped interconnects to extend the interface pads on a top surface of chip or die to an edge surface of the die.

Another object of the invention is to provide L-connects between a bond pad on a sidewall of a chip or die and a bond pad on a top or bottom surface of a chip or die using laser pantography or other metalization process.

Another object of the invention is to provide a method of preparing integrated circuit chips or die for stacking and interconnecting to produce a three-dimensional stack of circuits.

Another object of the invention is to provide patternization or islands on the surface of the chips or die where routing is not required in order to maintain the planarity of the die for future stacking.

Another object of the invention is to provide a method of interleaving thermal/routing spacers between the stacked chips or die to permit increased room or spacing for routing as well as thermal heat spreading.

Other objects and advantages of the present invention will become apparent from the following description and accompanying drawings. Basically, the invention involves extending the interface or bond pad of an IC chip or die to an edge surface or sidewall of the chip or die to enable easy access for interconnection to an adjacent chip or package of chips. This is particularly useful for stacking and interconnecting chips to produce a 3D array of stacked chips or chip packages. The invention has particular applicability to building 3D stacks of memory IC chips or die for increasing the memory density thereof. The invention involves L-connects (interconnects of a L configuration) which extend from a bond pad on an upper surface, for example, of a chip or die to a bond pad on an edge surface or sidewall of the chip or die, with the pad on the side of the chip being integral with or formed separate from the L-connect. The bond pads may be formed on one or more edge surfaces of the chip. The L-connects and the bond pads of the chip sidewalls are formed using laser pantography (computer controlled laser direct-write patterning), for example, or other metalization process, which is currently used to pattern metal interconnections of various kinds, and has the capability to form a continuous pattern on the top, sides, and bottom of chips or packaging substrates.

The invention additionally involves the optional incorporation of patternization in the unrouted portions of the chip's surface to keep the surface planar. By processing the same metalization process in the unrouted sections of the chip surface, the surface can be kept planar providing an improved surface for bonding to the next chip in the stack.

The invention additionally involves the optional incorporation of interleaved thermal/routing spacers between two or more of the chips in the stack. These spacers provide at least two purposes. The first is to provide increased space between the sidewall pads of one chip and the sidewall pads of the next chip. This increased spacing between the rows of sidewall pads provides additional routing room for cases where the connections between these sidewall pads require additional space. The second purpose of these spacers is to assist in the heat management of the stack. The spacer assists by reducing the heat density of the stack, spreading the heat more uniformly if made from a heat spreading material, and providing a mechanical interface to the stack for various heat extraction methods such as fins or liquid cooling.

BRIEF DESCRIPTION OF THE DRAWINGS

The accompanying drawings, which are incorporated into and form a part of the disclosure, illustrate embodiments of the invention and, together with the description, serve to explain the principles of the invention.

DETAILED DESCRIPTION OF THE INVENTION

The invention is directed to extending the conventional interface or bond pads on an integrated circuit chip or die to a sidewall of the chip or die to enable interconnection to an adjacent chip of a stacked array of chips or the interconnection of adjacent packages or arrays of chips. The invention utilizes L-connects or L-shaped conductive lines formed on the top and side surfaces, for example, which interconnect bond pads on the top surface of the chip with bond pads on a side surface of the chip. The bond pad on the side surface of the chip may be formed integral with the L-connect or separately. Also, each interconnect need not be of an L-shaped configuration, as other interconnect configurations can be utilized.

The L-connects and side bond pads are formed by a technique such as laser pantography whereby continuous conductive lines or interconnects may be formed on the top surface, over the edge and along a side surface of a chip or die. The laser pantography technique is exemplified by U.S. Pat. No. 4,992,847 issued Feb. 12, 1991 to D. B. Tuckerman. Since this technique is now well known in the art, a detailed description thereof is deemed unnecessary.

Figure 1:
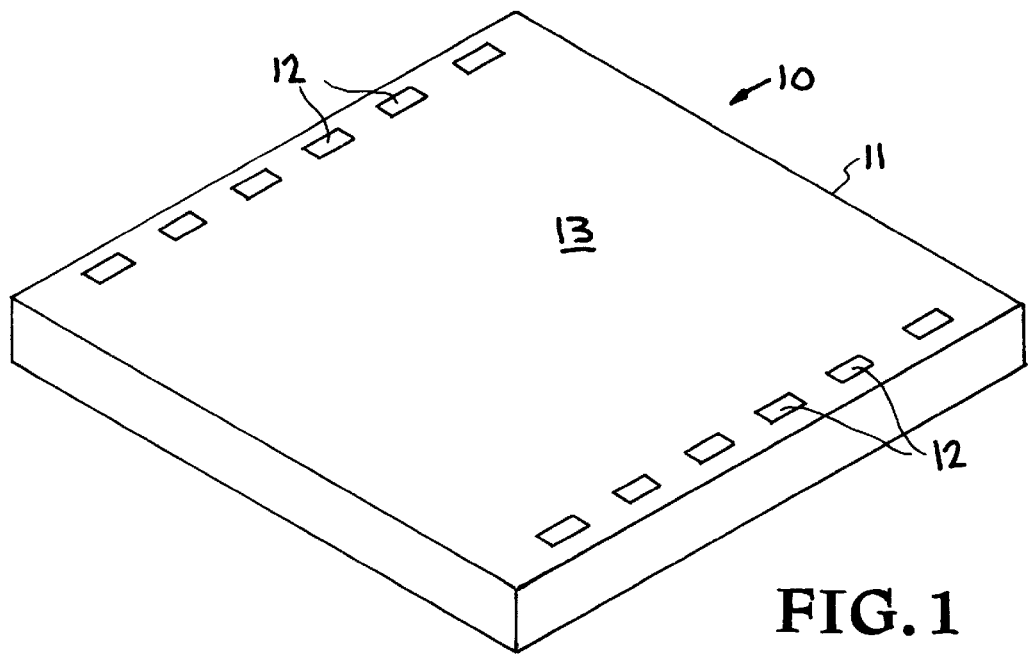
FIG. 1 is a perspective view of a bare integrated circuit (IC) chip or die with bond pads on the upper surface.

Referring now to the drawings, a conventional IC chip is illustrated in FIG. 1, and generally indicated at 10, composed of a substrate 11, which may be fabricated of silicon, for example, and provided with a plurality of conductive interface or bond pads 12 formed in a top surface 13 of substrate 11.

Figure 2:
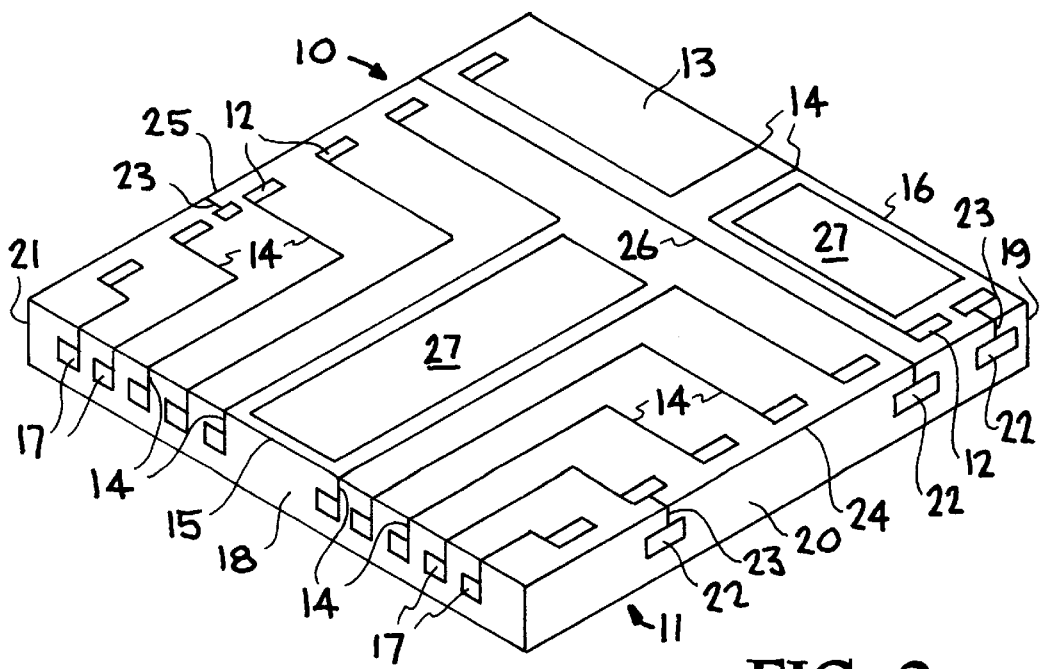
FIG. 2 illustrates the IC chip of FIG. 1 with L-connects and sidewall bond pads on opposite ends of the chip connected to the bond pads on the upper surface in accordance with the present invention.

The invention is illustrated in FIG. 2, wherein L-connects or L-shaped interconnects 14 extend from the bond pads 12 along top surface 13, over edges 15 or 16 of substrate 11 to bond pads 17 formed on edge surfaces or sidewalls 18 and 19 of substrate 11, with only bond pads on sidewall 18 being shown. The bond pads 17 of the sidewalls 18 and 19 may be formed integral with or separately from the L-connects 14, as described hereinafter. As a general practice the sidewall bond pads 17 are formed on only one side surface or sidewall 18, but as shown in FIG. 2, the L-connects 14 may extend to the opposite sidewall 19 with bond pads, not shown, formed on that sidewall.

If desired, sidewalls 20 and 21 may also be provided with bond pads 22 connected to bond pads 12 by interconnects 23, as shown in FIG. 2, which extend over edges 24 and 25 of substrate 11, with bond pads 22 being illustrated only on sidewall 20. Also, a bond pad 22 on sidewall 20 may be connected to a bond pad on sidewall 21 via an interconnect 26. Also, the top surface 13 of substrate 11 may be provided with optional patternizations or islands 27 which maintain the planarity of the surface of the chip or die in areas where interconnect routing is not required. The various bond pad and interconnects of FIG. 2 are to illustrate various arrangements and other interconnect/bond pad arrangement may be utilized.

Figure 3:
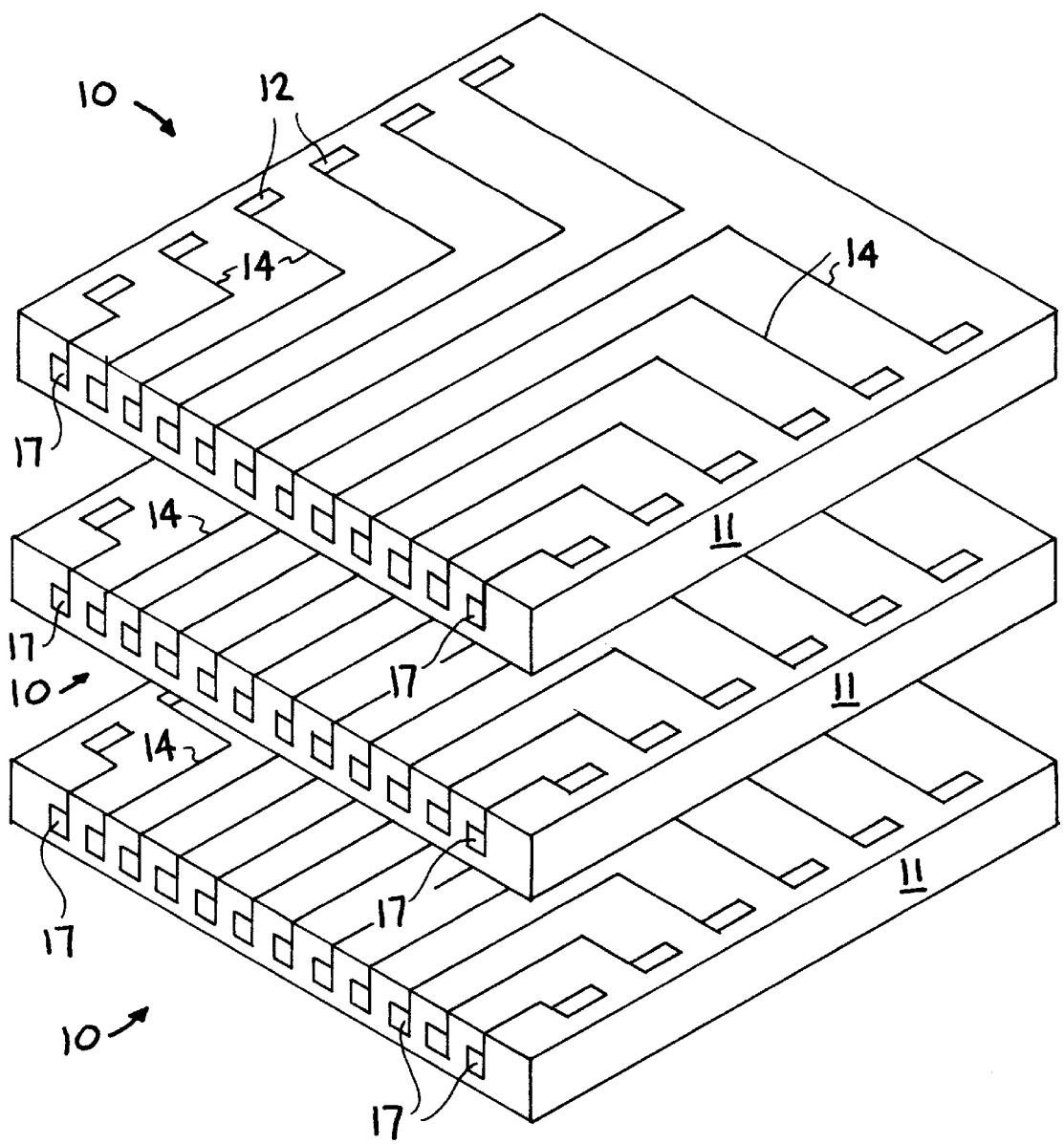
FIG. 3 is an exploded perspective, multilayer chip array incorporating the L-connects and sidewall bond pads on only one edge surface or sidewall of the chip.
Figure 4:
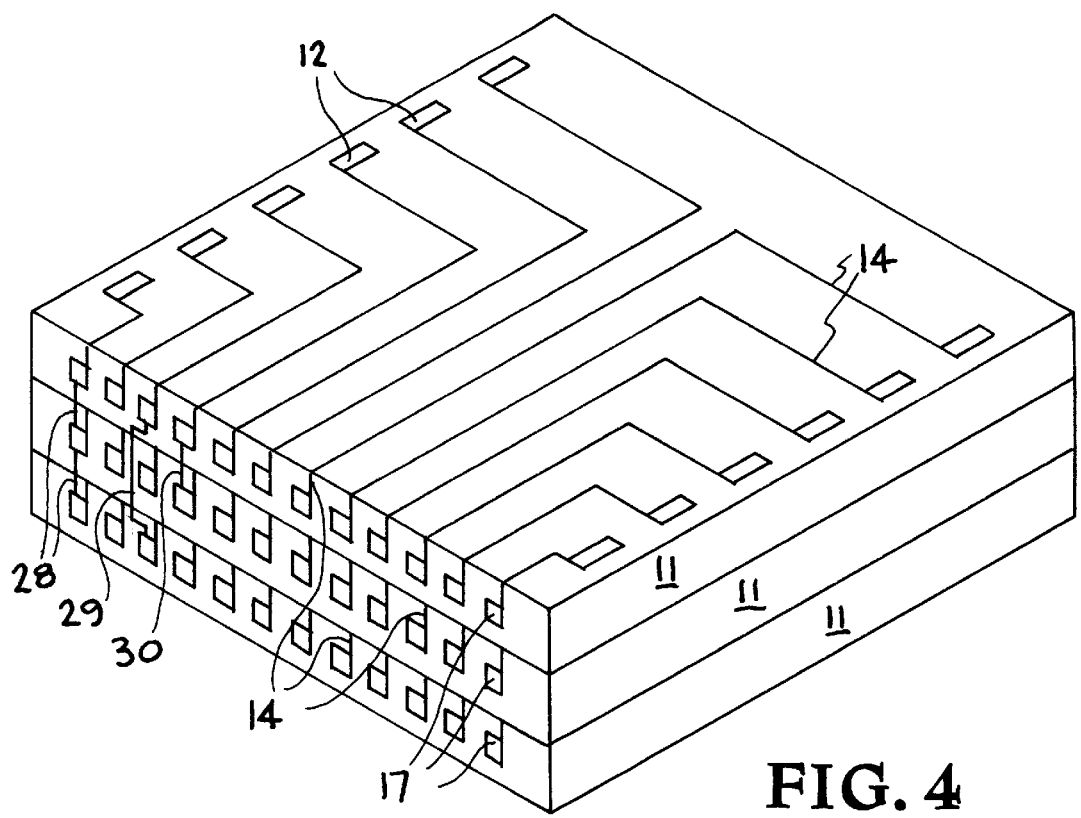
FIG. 4 is a perspective view of stacked die or chips of the type illustrated in FIG. 3.
Figure 5:
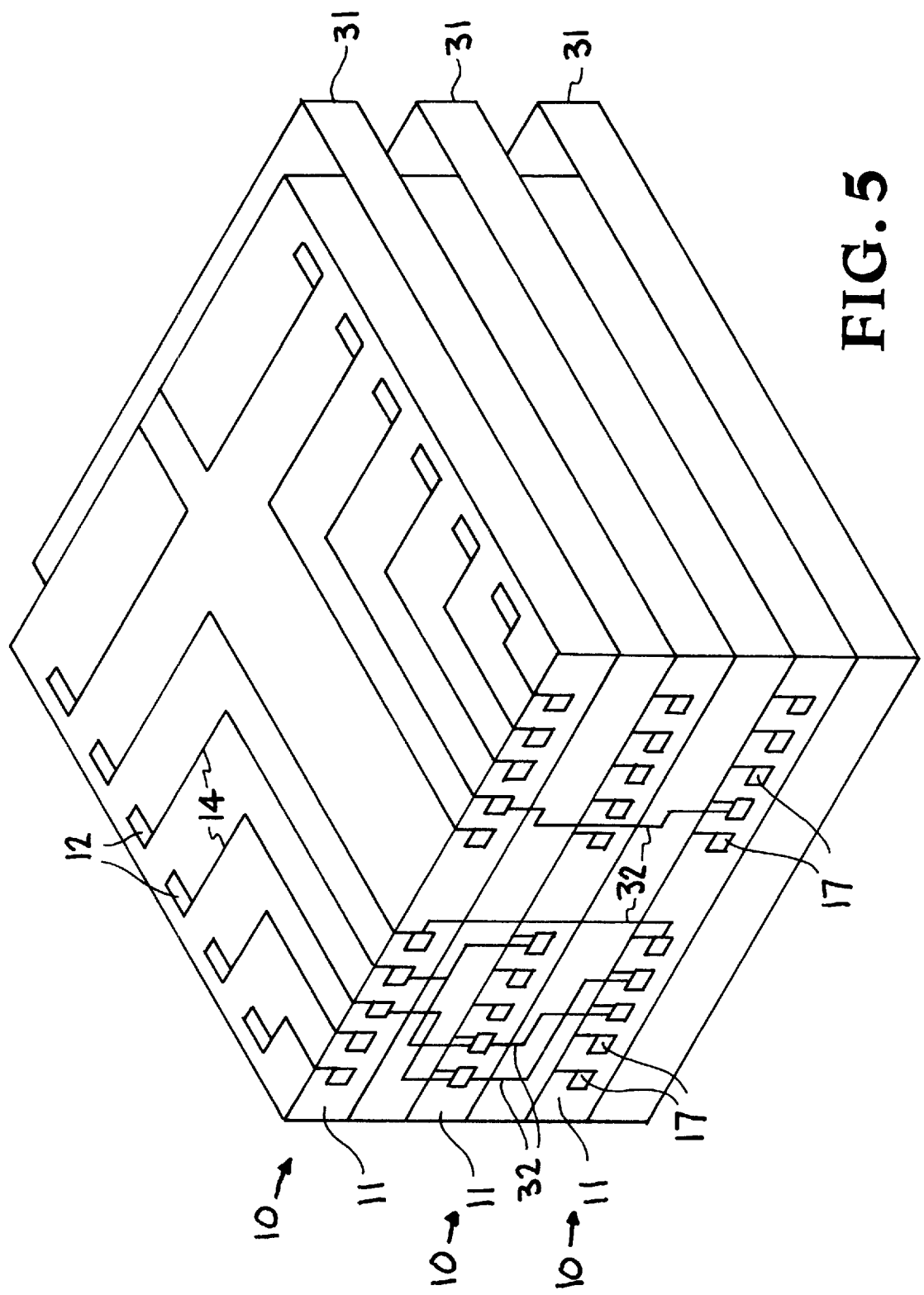
FIG. 5 is a perspective view similar to FIG. 4, but with interleaved spacers located between the adjacent die or chips.

As shown in FIGS. 3 and 5, IC chips 10, of a more simplified form than illustrated in FIG. 2, having sidewall bond pads formed on one or more edge surfaces or sidewalls of the substrate, are shown in an exploded and stacked arrangement. While each of the IC chips 10 are illustrated in FIGS. 3 and 4 as being identified, there may be a different number and/or position of the sidewall bond pads on each IC chip. The sidewall bond pads 17 on the substrate 11 are interconnected as desired by conductive interconnects as indicated at 28, 29 and 30 (see FIGS. 4 and 5) to connect desired bond pads on one substrate to desired bond pads on another substrate of the stack. Also, the bond pads of the three substrate stack may be connected to bond pads on another substrate or stack of IC chips, thereby enabling compact packaging of single and/or stacked IC chips. While the three-dimensional stack illustrated in FIGS. 3 and 4 involve three (3) IC chips, additional chips may be included in a stack depending on the density and space desired.

The three-dimensional stack illustrated in FIG. 5 shows a stack where spacers 31 have been interleaved between the circuit chips 10. Spacers may be added for one or more purposes. They form a mechanical interface for heat management as well as increased spacing between sidewall pads 17 for routing. These spacers can be made of similar materials as the chips themselves or dissimilar materials provided the thermal coefficients of expansion between the different materials do not over-stress the stack over the desired operating range of the stack. FIG. 5 also depicts the additional routing space required by the multilayer routes 32 and obtained by the incorporation of spacers 31.

The L-connects 14 and sidewall bond pads 17, as shown in FIG. 2, are formed on substrate 11 by laser pantography or another metalization process. The sidewall bond pads 17 may be fabricated with or separate from the L-connects 14. Again, each interconnect on the substrate need not be of an L-shaped configuration. The fabrication technique for producing the L-connects and bond pad is well known in the field, and thus detailed example of the fabrication of the die or chips as illustrated is not deemed necessary.

It has thus been shown that the present invention provides a means and method by which IC chips can be readily stacked, whereby packaging can be miniaturized and, for example, the memory density of memory chips can be increased. This is accomplished by the use of conductive extensions from the bond pads on the top surface, for example, of a chip to a sidewall of the chip, whereby interconnection to other chips or packages of chips can be readily accomplished.

While particular embodiments of the invention and a specific method for forming an embodiment, along with material parameters of the embodiment and/or method, have been set forth to exemplify and set forth the principles of the invention, such are not intended to be limiting. Modifications and changes may become apparent to those skilled in the art, and it is intended that the invention be limited only by the scope of the appended claims.

The invention claimed is:

1. In an integrated circuit chip having a substrate with an interface surface and a side surface and with interface pads positioned entirely on an interface surface thereof, the improvement comprising:

a plurality of pads positioned entirely on at least one side surface which is traverse to said interface surface of said substrate, and interconnects extending from said interface pads on said interface surface to said pads located entirely on said at least one side surface of said substrate.

2. The improvement of claim 1, wherein said interconnects are of an L-shaped configuration.

3. The improvement of claim 1, wherein said interconnects extend from said interface pads to the same, opposite, or neighboring side surfaces of said substrate.

4. The improvement of claim 1, additionally including a plurality of integrated circuit chips stacked on one another, and wherein at least certain of said pads on said side surfaces of the substrates are interconnected by interconnects extending between said pads.

5. A method of preparing integrated circuit die for stacking and interconnecting to produce a three-diminsional stack of circuit die, including:

forming interconnects on a surface of each die and on at least one sidewall of each die so as to be in contact with interface pads located entirely on the surface of each die and bonding pads located entirely on at least one sidewall of each die, thereby the circuit die when stacked on one another, can be interconnected via interconnected bonding pads located on the sidewall of each die.

6. The method of claim 5, wherein the bonding pads are formed integral with an end of an interconnect on the side wall of a die.

7. The method of claim 6, wherein forming of the interconnects is carried out using laser pantography.

8. The method of claim 5, wherein said bonding pads are formed using laser pantography.

9. The method of claim 5, additionally including stacking the circuit die on one another, and interconnecting at least certain of said bonding pads of the stacked circuit dies, thereby forming three-dimensional stacks of integrated circuit die.

10. The method of claim 7, additionally including forming the bonding pads on the sidewall of a die integral with the forming of the interconnects.

11. The method of claim 5, wherein the interconnects are of an L-shaped configuration.

12. An improved method of fabricating integrated circuit chips which enables stacking of the chips, comprising, routing of bonding pads on a surface on a die to a sidewall of a die; and forming bonding pads located entirely on the sidewall of the die and in contact with the interconnects.

13. The improved method of claim 12, additionally including forming of at least certain of the interconnects in an L-shaped configuration.

14. The improved method of claim 12, wherein forming of at least the interconnects is carried out using laser pantography.

15. The improved method of claim 12, additionally including forming at least one island on the surface of the die.

16. The improved method of claim 12, additionally including positioning a spacer between adjacent stacked chips.

17. The improvement of claim 4, additionally including a plurality of spacers interleaved between the adjacent chips.

* * * * *